US005342731A

United States Patent [19]

Kelly et al.

[11] Patent Number: 5,342,731

[45] Date of Patent: Aug. 30, 1994

[54] LAMINAR THERMAL IMAGING MEDIUM ACTUATABLE IN RESPONSE TO INTENSE IMAGE-FORMING RADIATION UTILIZING POLYMERIC HARDENABLE ADHESIVE LAYER THAT REDUCES TENDENCY FOR DELAMINATION

[75] Inventors: Neal F. Kelly, Woburn; Eugene L. Langlais, Norfolk, both of Mass.

[73] Assignee: Polaroid Corporation, Cambridge, Mass.

[21] Appl. No.: 616,853

[22] Filed: Nov. 21, 1990

[51] Int. Cl.[5] .......... G03F 7/34

[52] U.S. Cl. .......... 430/253; 430/200; 430/258; 430/259; 430/273

[58] Field of Search .......... 430/253, 259, 273, 200, 430/258

[56] References Cited

U.S. PATENT DOCUMENTS

| | | | |
|---|---|---|---|
| 2,616,961 | 11/1952 | Groak . | |
| 3,241,973 | 3/1966 | Thommes . | |
| 3,257,942 | 6/1966 | Ritzerfeld . | |
| 3,340,086 | 9/1967 | Groak . | |
| 3,396,401 | 8/1968 | Nonomura . | |
| 3,592,644 | 7/1971 | Vrancken et al. . | |
| 3,632,376 | 1/1972 | Newman . | |
| 3,770,438 | 11/1973 | Celeste . | |
| 3,882,187 | 5/1975 | Takiyama et al. . | |
| 3,924,041 | 12/1975 | Miyayama . | |
| 3,928,299 | 12/1975 | Rosenkranz et al. . | |
| 4,123,578 | 10/1978 | Perrington . | |
| 4,157,412 | 6/1979 | Deneau . | |
| 4,704,310 | 11/1987 | Tighe | 427/261 |
| 4,707,406 | 11/1987 | Inaba et al. | 428/336 |
| 4,895,830 | 1/1990 | Takeda et al. | 503/227 |
| 5,059,509 | 10/1991 | Mino et al. | 430/257 |

FOREIGN PATENT DOCUMENTS

| | | |
|---|---|---|
| 0314349 | 5/1989 | European Pat. Off. . |
| 8804237 | 6/1988 | PCT Int'l Appl. . |
| 1156996 | 7/1969 | United Kingdom . |

*Primary Examiner*—Charles L. Bowers, Jr.
*Assistant Examiner*—Christopher G. Young
*Attorney, Agent, or Firm*—Louis G. Xiarhos

[57] ABSTRACT

Disclosed is a laminar thermal imaging medium, actuatable in response to intense image-forming radiation for production of a pair of images upon exposure of the medium and separation of the respective sheets, the medium including a polymeric hardenable adhesive layer which in its unhardened condition reduces the tendency for the laminar thermal imaging medium to delaminate on application of physical stresses to the medium, and which is hardenable to a durable base for one of said images. Also disclosed is a method of preparing a laminar imaging medium as aforedescribed wherein said medium after lamination of component elements thereof is cut into individual units and, thereafter, the hardenable adhesive layer of such units is hardened to a durable base for an image carried thereon.

12 Claims, 1 Drawing Sheet

LAMINAR THERMAL IMAGING MEDIUM ACTUATABLE IN RESPONSE TO INTENSE IMAGE-FORMING RADIATION UTILIZING POLYMERIC HARDENABLE ADHESIVE LAYER THAT REDUCES TENDENCY FOR DELAMINATION

BACKGROUND OF THE INVENTION

This invention relates to a thermal imaging medium for the recordation of information. More particularly, it relates to a laminar imaging medium having improved resistance to stress-induced delamination.

The provision of images by resort to media which rely upon the generation of heat patterns has been well known. Thermally imageable media are particularly advantageous inasmuch as they can be imaged without certain of the requirements attending the use of silver halide based media, such as darkroom processing and protection against ambient light. Moreover, the use of thermal imaging materials avoids the requirements of handling and disposing of silver-containing and other processing streams or effluent materials typically associated with the processing of silver halide based imaging materials.

Various methods and systems for preparing thermally generated symbols, patterns or other images have been reported. Examples of these can be found in U.S. Pat. No. 2,616,961 (issued Nov. 4, 1952 to J. Groak); in U.S. Pat. No. 3,257,942 (issued Jun. 28, 1966 to W. Ritzerfeld, et al.); in U.S. Pat. No. 3,396,401 (issued Aug. 6, 1968 to K. K. Nonomura); in U.S. Pat. No. 3,592,644 (issued Jul. 13, 1971 to M. N. Vrancken, et al.); in U.S. Pat. No. 3,632,376 (issued Jan. 4, 1972 to D. A. Newman); in U.S. Pat. No. 3,924,041 (issued Dec. 2, 1975 to M. Miyayama, et al.); in U.S. Pat. No. 4,123,578 (issued Oct. 31, 1978 to K. J. Perrington, et al.); in U.S. Pat. No. 4,157,412 (issued Jun. 5, 1979 to K. S. Deneau); in Great Britain Patent Specification 1,156,996 (published Jul. 2, 1969 by Pitney-Bowes, Inc.); and in International Patent Application No. PCT/US87/03249 of M. R. Etzel (published Jun. 16, 1988, as International Publication No. WO 88/04237).

In the production of a thermally actuatable imaging material, it may be desirable and preferred that an image-forming substance be confined between a pair of sheets in the form of a laminate. Laminar thermal imaging materials are, for example, described in the aforementioned U.S. Pat. Nos. 3,924,041 and 4,157,412 and in the aforementioned International Patent Application No. PCT/US87/03249. It will be appreciated that the sheet elements of a laminar medium will afford protection of the image-forming substance confined therebetween against the effects of abrasion, rub-off and other physical stimuli. In addition, a laminar medium can be handled as a unitary structure, thus, obviating the requirement of bringing the respective sheets of a two-sheet imaging medium into proper position in the printer or other apparatus used for thermal imaging of the medium material.

In a laminar thermal imaging medium comprising at least a layer of image-forming substance confined between a pair of sheets, image formation may depend upon preferential adhesion of the image-forming substance to one of the sheets. Typically, such a laminar medium material will be designed such that the image-forming substance will be preferentially adherent to one of the sheets, before thermal actuation of regions of the laminar medium, and preferentially adherent to the other sheet in actuated or "exposed" regions. Separation of the sheets of the laminar medium material, in the case where there has been no thermal actuation or "exposure", provides a layer of image-forming substance on the one sheet to which it is preferentially adherent. Separation of the sheets of the medium material, in the case where the medium is exposed to radiation over its entire area and sufficient in intensity to reverse the preferential adhesion, provides the layer of image-forming substance on the opposite sheet. Accordingly, exposure of the medium selectively according to a predetermined pattern, and separation of the sheets after exposure, provides a pair of images on the respective sheets.

In the aforementioned International Application No. PCT/US87/03249, there is disclosed a thermal imaging medium which includes a layer of porous or particulate image-forming material and which is especially adapted to the provision of high resolution images by subjecting the medium to brief exposure to intense image-forming radiation. According to a preferred embodiment, the image-forming material (preferably, a layer of carbon black) is coated over the heat-activatable image-forming surface of a first sheet and is covered with a second laminated sheet, such that, the image-forming substance is confined between the sheets of a laminar thermal imaging medium. Upon exposure of the medium (for example, by laser scanning) and on separation of the sheets, a pair of images is obtained.

A first image comprises exposed portions of image-forming substance more firmly attached to the first sheet by heat activation of the heat-activatable image-forming surface thereof. A second image comprises non-exposed portions of the image-forming substance carried or transferred to the second sheet.

The respective images obtained by separating the sheets of an exposed thermal imaging medium having an image-forming substance confined therebetween may exhibit substantially different characteristics. Apart from the imagewise complementary nature of these images and the relation that each may bear as a "positive" or "negative" of an original, the respective images may differ in character. Differences may depend upon the properties of the image-forming substance, on the presence of additional layer(s) in the medium, and upon the manner in which such layers fail adhesively or cohesively upon separation of the sheets. Either of the pair of images may, for reasons of informational content, aesthetics or otherwise, be desirably considered the principal image. The principal image may, however, depending upon the aforementioned properties and modes of failure, exhibit decidedly inferior properties, such as poorer handling characteristics, durability and abrasion resistance, as compared with the complementary image of secondary importance.

In the production of thermal images from media of the type described in the aforementioned International Application, it will oftentimes be preferred, in the case of high density images, that the principal image be that which is formed by transfer of non-exposed regions of coated image-forming substance to a sheet separated from an imaged medium. It will be recognized that an alternative is to form a high density image on the opposed sheet by firmly attaching the image-forming substance in areas of exposure. This is the case because the medium provides complementary images and the desired high density image can be formed on either sheet by addressing the thermally actuatable medium according to which sheet shall bear the high density image. This alternative to the formation of a high density image is, however, disadvantageous since the areas of high density are created in areas of exposure (by activation of a heat-activatable image-forming zone or layer) and large areas of exposure require correspondingly large areas of laser actuation and energy utilization and highly accurate laser scanning and tracking. Errors in tracking will result in discontinuities (whiteness or voids) by failure to attach minute regions of image-forming substance and by their removal to the opposed sheet upon separation of the sheets. Owing to the psychophysical nature of human vision, minute regions of lightness (voids) against an expansive darkness tend to be noticeable.

It will, thus, be preferred that a high density image be the result of the transfer in non-exposed regions of coated and continuous regions of image-forming material (with minimal or no discontinuities or coverage voids), rather than the result of firm connection of high density regions of imaging material by laser-actuated operation of the heat-activatable image-forming surface, where tracking errors increase the possibility of creating noticeable areas of discontinuity (whiteness) against the expansive high density region.

Inasmuch as a laminar thermal imaging medium of the aforedescribed type will be designed such that the image-forming substance is preferentially adherent to only one of the sheets before and until thermal actuation, and will be designed to permit separation or peeling of the sheets after thermal exposure, the laminar medium material may exhibit an undesirable tendency to delaminate upon subjection to certain physical stresses that may be created during a manufacturing operation (e.g., bending, winding, cutting or stamping operations). It may be desirable in some instances to form a laminar medium from a pair of endless sheet or web materials and to then cut, slit or otherwise provide therefrom individual film units of predetermined size. A reciprocal cutting and stamping operation used for the cutting of individual film units may create stress influences in the medium, causing the sheets to separate at the interface of weakest adhesivity—typically, at the interface where, by thermal actuation, the preferential adhesion of the image-forming substance would be reversed.

In U.S. Pat. No. 5,200,297, issued Apr. 6, 1993 to Neal F. Kelly, entitled, Stress-Absorbing Thermal Imaging Laminar Medium, there is disclosed and claimed a laminar thermal imaging medium including a polymeric stress-absorbing layer for reducing the tendency of such a medium material to delaminate as the result of application, during manufacture or use, of physical stresses to the medium material. As disclosed in such patent application, a polymeric stress-absorbing layer of compressible or elongatable material can be placed in close proximity to an interface having the greatest tendency to delaminate, so as to reduce the occurrence of undesired delamination during manufacture of the laminar medium or during use thereof in an imaging method or apparatus.

While the positioning of the polymeric stress-absorbing layer in a laminar thermal imaging medium can vary, consistent with the desired objective of minimizing undesired delamination, the required properties of the layer may adversely affect other desired properties of either the thermal imaging medium or an image obtained therefrom. For example, in the manufacture of a laminar imaging medium of the type described in the aforementioned International Application No. PCT/US87/03249, a soft adhesive material can be employed as an adhesive layer for the lamination of a second sheet to a first sheet carrying the layer of image-forming substance. Upon exposure and separation of the first and second sheets, first and second images, as aforedescribed, are provided. The second image comprises non-exposed portions of the image-forming substance carried or transferred to the second sheet with the aid of the adhesive thereof. The adhesive material is effective for the carrying or removal of unexposed image-forming substance and for the provision of stress-absorbing properties which minimize undesired delamination. The adhesive also serves, however, as a base for the second image which is formed in image-forming substance. Softness of the adhesive base tends to reduce the durability of the image which, for reasons mentioned hereinbefore, may be the principal image.

It will be appreciated that a thermal imaging medium which is designed for separation of a pair of sheets and images will be especially desirable where the imaging medium is resistant to undesired delamination during the manufacture thereof and is adapted to provide an image having satisfactory handling and durability characteristics.

SUMMARY OF THE INVENTION

It has been found that improvements can be realized in the manufacture of a laminar thermal imaging medium and in the durability of an image formed by non-exposed regions of a porous or particulate image-forming substance removed to one of a pair of sheets of the thermally actuated imaging medium. These improvements are obtained by including in the thermally actuatable imaging medium, as an adhesive for said removal, a polymeric hardenable adhesive layer. The hardenable adhesive layer serves in its unhardened condition to laminate the sheets of the medium into a unitary medium material and to protect the medium against the tendency to delaminate (at the weakest interface thereof) upon subjection of the medium to physical stresses during the manufacture thereof. The layer is thereafter hardened to a layer of sufficient hardness to provide in the image the aforementioned improvements in handling and durability.

According to an article aspect of the present invention, there is provided a laminar thermal imaging medium, actuatable in response to intense image-forming radiation for production of an image, said laminar medium comprising in order:

a first sheet transparent to said image-forming radiation and having at least a surface zone or layer of polymeric material heat-activatable upon subjection of said thermal imaging medium to brief and intense radiation;

a layer of porous or particulate image-forming substance having cohesivity in excess of its adhesivity for said polymeric heat-activatable layer;

a second sheet covering said layer of porous or particulate image-forming substance and adhesively laminated directly or indirectly to said image-forming substance by an adhesive layer, said second sheet, upon separation of said first and second sheets after exposure to said intense radiation, being adapted to the removal therewith of unexposed portions of said image-forming substance;

said adhesive layer being a polymeric hardenable adhesive layer, said hardenable adhesive layer being capable in its unhardened condition of reducing the tendency for said laminar thermal imaging medium to delaminate on application of physical stresses to said medium and being hardenable to a layer of sufficient hardness to provide a durable base for said image.

According to a method aspect of the present invention, there is provided a method of preparing a laminar thermal imaging medium which comprises the steps of:

providing a first element comprising a first sheet transparent to image-forming radiation and having at least a surface zone or layer of polymeric material heat-activatable upon subjection of said thermal imaging medium to brief and intense radiation, said element carrying a layer of porous or particulate image-forming substance having cohesivity in excess of its adhesivity for said polymeric heat-activatable layer;

providing a second element comprising a second sheet carrying a layer of polymeric hardenable adhesive, said layer being capable of adhesively bonding said first and second elements, with the respective sheets thereof outermost, into a unitary laminar medium, said layer of hardenable adhesive being capable in its unhardened condition of reducing the tendency for said laminar medium to delaminate on application of stresses to said medium;

laminating said first and second elements into said unitary laminar medium;

cutting said unitary laminar medium into individual laminar units of predetermined size; and hardening said hardenable adhesive of said laminar units into a durable polymeric layer.

For a fuller understanding of the nature and objects of the invention, reference should be had to the following description taken in conjunction with the accompanying drawings.

DETAILED DESCRIPTION OF THE INVENTION

As mentioned previously, the laminar thermally actuatable imaging medium material of the invention embodies a hardenable polymeric adhesive layer which is effective during manufacturing of the medium to protect the medium against delamination occasioned by the stress of manufacturing (e.g., bending, cutting or slitting) operations and which can, thereafter, be hardened to a layer which provides a durable base for the image formed thereon.

Figure 1:
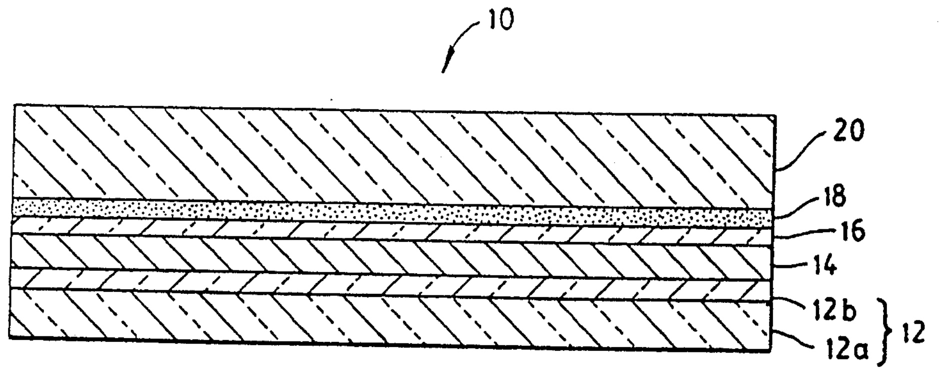
FIG. 1 is a diagrammatic cross-sectional view of a preferred laminar thermally actuatable imaging medium material of the invention.
Figure 2:
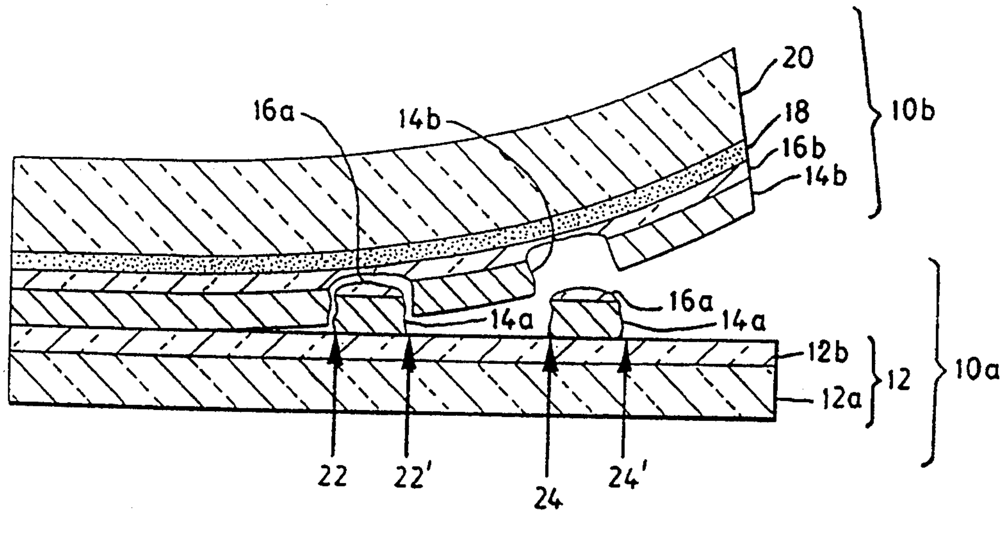
FIG. 2 is a diagrammatic cross-sectional view of the laminar imaging medium of FIG. 1, shown in a state of partial separation after thermal imaging.

In FIG. 1, there is shown a preferred laminar medium material of the invention suited to production of a pair of high resolution images, shown in FIG. 2 as images 10*a* and 10*b* in a partial state of separation. Thermal imaging medium 10 includes a first sheet-like or web material 12 (comprising sheet material 12*a* and heat-activatable zone or layer 12*b*) having superposed thereon, and in order, porous or particulate image-forming layer 14, release layer 16, hardenable polymeric adhesive layer 18 and second sheet-like or web material 20.

Upon exposure of medium material 10 to radiation, exposed portions of image-forming layer 14 are more firmly attached to sheet-like web material 12, so that, upon separation of the respective sheet-like materials, as shown in FIG. 2, a pair of images, 10*a* and 10*b*, is provided. The nature of certain of the layers of preferred thermal imaging medium material 10 and their properties are importantly related to the manner in which the respective images are formed and partitioned from the medium after exposure. The functioning of hardenable adhesive layer 18 is important to the reduction of undesired delamination at the interface between heat-activatable zone or layer 12*b* and porous or particulate image-forming layer 14 of the preferred thermal imaging medium shown in FIG. 1. The various layers of medium material 10 are described in detail hereinafter.

Sheet-like web material 12 comprises a transparent material through which imaging medium 10 can be exposed to radiation. Web material 12 can comprise any of a variety of sheet-like materials, although polymeric sheet materials will be especially preferred. Among preferred web materials are polystyrene, polyethylene terephthalate, polyethylene, polypropylene, poly(vinyl chloride), polycarbonate, poly(vinylidene chloride), cellulose acetate, cellulose acetate butyrate and copolymeric materials such as the copolymers of styrene, butadiene and acrylonitrile, including poly(styrene-co-acrylonitrile). An especially preferred web material from the standpoints of durability, dimensional stability and handling characteristics is polyethylene terephthalate, commercially available, for example, under the tradename Mylar, of E. I. duPont de Nemours & Co., or under the tradename Kodel, of Eastman Kodak Company.

Heat-activatable zone or layer 12*b* provides an essential function in the imaging of medium material 10 and comprises a polymeric material which is heat activatable upon subjection of the medium to brief and intense radiation, so that, upon rapid cooling, exposed portions of the surface zone or layer are firmly attached to porous or particulate image-forming layer 14. If desired, surface zone 12*b* can be a surface portion or region of sheet-like web material 12, in which case, layers 12*a* and 12*b* will be of the same or similar chemical composition. In general, it will be preferred that layer 12*b* comprise a discrete polymeric surface layer on sheet material 12*a*. Layer 12*b* will desirably comprise a polymeric material having a softening temperature lower than that of sheet material 12*a*, so that exposed portions of image-forming layer 14 can be firmly attached to web material 12(12*a*). A variety of polymeric materials can be used for this purpose, including polystyrene, poly(styrene-co-acrylonitrile), poly(vinyl butyrate), poly(methylmethacrylate), polyethylene and poly(vinyl chloride).

The employment of a thin heat-activatable layer 12*b* on a substantially thicker and durable web material 12*a* permits desired handling of web material 12 and desired imaging efficiency. The use of a thin heat-activatable layer 12*b* facilitates the concentration of heat energy at or near the interface between layers 12*b* and image-forming layer 14 and permits optimal imaging effects and reduced energy requirements. It will be appreciated that the sensitivity of layer 12*b* to heat activation (or softening) and attachment or adhesion to layer 14 will depend upon the nature and thermal characteristics of layer 12*b* and upon the thickness thereof.

Heat-activatable layer 12*b* can be provided on web material 12*a* by resort to known coating methods. For example, a layer of poly(styrene-co-acrylonitrile) can be applied to a web 12*a* of polyethylene terephthalate by coating from an organic solvent such as methylene chloride. In general, the desired handling properties of sheet material 12 will be influenced by the nature of sheet material 12*a* itself, inasmuch as layer 12*b* will be coated thereon as a thin layer. The thickness of web material 12 will depend upon the desired handling characteristics of medium material 10 during manufacture and during imaging and any post-imaging steps. Thickness will also be dictated in part by the intended use of the image to be carried thereon and by exposure conditions, such as the wavelength and power of the exposing source. Typically, sheet material 12 will vary in thickness from about 0.5 mil to seven mils (0.013 mm to 0.178 mm). Good results are obtained using, for example, a web material 12*a* having a thickness of about 1.5 to 1.75 mils (0.038 mm to 0.044 mm) carrying a layer 12*b* of poly(styrene-co-acrylonitrile) having a thickness of about 0.1 micron to five microns.

Heat-activatable layer 12*b* can include additives or agents providing known beneficial properties. Adhesiveness-imparting agents, plasticizers, adhesion-reducing agents, or other agents can be used. Such agents can be used, for example, to control adhesion between layers 12*b* and 14, so that, undesired separation at the interface thereof is minimized during manufacture of laminar medium 10 or during use thereof in a thermal imaging method or apparatus. Such control also permits the medium, after imaging and separation of sheet-like web materials 12 and 20, to be partitioned in the manner shown in FIG. 2.

Image-forming layer 14 comprises an image-forming substance deposited onto heat-activatable zone or layer 12*b* as a porous or particulate layer or coating. Layer 14, also referred to as a colorant/binder layer, can be formed from a colorant material dispersed in a suitable binder, the colorant being a pigment or dye of any desired color, and preferably, being substantially inert to the elevated temperatures required for thermal imaging of medium 10. Carbon black is a particularly advantageous and preferred pigment material. Preferably, the carbon black material will comprise particles having an average diameter of about 0.01 to 10 micrometers (microns). Although the description hereof will refer principally to carbon black, other optically dense substances, such as graphite, phthalocyanine pigments and other colored pigments can be used. If desired, substances which change their optical density upon subjection to temperatures as herein described can also be employed.

The binder for the image-forming substance or layer 14 provides a matrix to form the porous or particulate substance thereof into a cohesive layer and serves to adhere layer 14 to heat-activatable zone or layer 12*b*. In general, it will be desired that image-forming layer 12*b* be adhered to surface zone or layer 12*b* sufficiently to prevent accidental dislocation either during the manufacture of medium 10 or during the use thereof. Layer 14 should, however, be separable (in non-exposed regions) from zone or layer 12*b*, after imaging and separation of sheets or webs 12 and 20, so that partitioning can be accomplished in the manner shown in FIG. 2.

Image-forming layer 14 can be conveniently deposited onto surface zone or layer 12*b*, using any of a number of known coating methods. According to a one embodiment, and for ease in coating layer 14 onto zone or layer 12*b*, carbon black particles are initially suspended in an inert liquid vehicle (typically, water) and the resulting suspension or dispersion is uniformly spread over heat-activatable zone or layer 12*b*. On drying, layer 14 is adhered as a uniform image-forming layer on the surface thereof. It will be appreciated that the spreading characteristics of the suspension can be improved by including a surfactant, such as ammonium perfluoroalkyl sulfonate, nonionic ethoxylate or the like. Other substances, such as emulsifiers can be used or added to improve the uniformity of distribution of the carbon black in its suspended state and, thereafter, in its spread and dry state. Layer 14 can range in thickness and typically will have a thickness of about 0.1 micron to about 10 microns. In general, it will be preferred from the standpoint of image resolution, that a thin layer be employed. Layer 14 should, however, be of sufficient thickness to provide desired and predetermined optical density in the images prepared from imaging medium 10.

Suitable binder materials for image-forming layer 14 include gelatin, polyvinylalcohol, hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferable, the ratio of pigment to binder will be in the range of from about 4:1 to about 10:1. A preferred binder material for a carbon black pigment material is polyvinylalcohol.

If desired, additional additives or agents can be incorporated into image-forming layer 14. Thus, submicroscopic particles, such as chitin, polytetrafluoroethylene particles and/or polyamide can be added to colorant/binder layer 14 to improve abrasion resistance. Such particles can be present, for example, in amounts of from about 1:2 to about 1:20, particles to layer solids, by weight.

For the production of images of high resolution, it will be essential that image-forming layer 14 comprise materials that permit fracture through the thickness of the layer and along a direction substantially orthogonal to the interface between surface zone or layer 12*b* and image-forming layer 14, i.e., substantially along the direction of arrows 22, 22', 24, and 24', shown in FIG. 2. It will be appreciated that, in order for images 10*a* and 10*b* to be partitioned in the manner shown in FIG. 2, imaging-forming layer 14 will be orthogonally fracturable as aforedescribed and will have a degree of cohesivity in excess of its adhesivity for heat-activatable zone or layer 12*b*. Thus, on separation of webs 12 and 20 after imaging, layer 14 will separate in non-exposed areas from heat-activatable layer 12*b* and remain in exposed areas as porous or particulate portions 14*a* on sheet or web 12. Layer 14 is an imagewise disruptible layer owing to the porous or particulate nature thereof and the capacity for the layer to fracture or break sharply at particle interfaces.

Shown in imaging medium 10 is a second sheet-like or web material 20 covering image-forming layer 14 through adhesive layer 18 and release layer 16. Web material 20 is laminated over image-forming layer 14 and provides the means by which non-exposed areas of image-forming layer 14 can be carried from web material 12 in the form of portions 14*b* of image 10*b*, as shown in FIG. 2. Adhesive layer 18 serves important functions during the manufacture of laminar medium 10 and permits the production of an image 10*b* having satisfactory durability.

Adhesive layer 18 of thermal medium 10 comprises a hardenable adhesive layer which is capable of protecting the medium against stresses that would create a delamination of the medium, typically, in the case of medium 10 of FIG. 1, at the interface between zone or layer 12*b* and image-forming layer 14. The physical stresses which tend to promote delamination and which can be alleviated by hardenable layer 18 can vary and include stresses created by bending the laminar medium and stresses created by winding, unwinding, cutting, slitting or stamping operations. Since hardenable layer 18 can vary in composition, it will be appreciated that a particular adhesive may, for example, provide protection of the medium against delamination promoted by bending of the medium, while providing little or no protection against delamination caused, for example, by a slitting or stamping-and-cutting operation. Certain adhesive systems (e.g., epoxy systems in an uncured and relatively fluid condition) may provide protection against bending and promote flattening of the laminar medium while providing little or no protection against stresses of cutting or slitting operations. Other adhesive systems (e.g. UV-curable pressure-sensitive adhesive systems) will be preferred where cutting and slitting operations are desirably performed.

It will be appreciated that individual film units of predetermined size and suited, for example, to stacking in a cassette for feeding into a printer apparatus will be of particular interest. Such film units can be prepared by preparing an endless web of medium material having the arrangement of layers shown in FIG. 1 and cutting individual units of predetermined size from the web supply. A slitting or cutting operation, such as a reciprocal stamping and cutting operation creates stresses in a medium material of the type shown in FIG. 1 and may induce a delamination of the medium at the interface thereof having the weakest adhesivity. The use in such a medium of an unhardened layer 18 which is capable of alleviating the stresses of slitting and cutting operations markedly improves manufacturing efficiencies and will be especially preferred.

While applicants do not wish to be bound by any particular theory or mechanism in explanation of the manner in which layer 18 serves to minimize stress-induced delamination of the medium material, it is believed that layer 18 may serve to absorb physical stresses applied to medium and thereby reduce the incidence of delamination. Alternatively, layer 18 may serve to distribute stresses throughout the layer or otherwise prevent applied stresses from being transmitted through the medium and from causing delamination.

According to a method aspect of the invention, medium 10 will be prepared by the lamination of first and second sheet-like web elements or components. A first element or component comprises web material 12 carrying image-forming layer 14 and release layer 16. If desired, an optional layer of adhesive material (not shown) can be coated onto release layer 16 for adhesive-to-adhesive bonding of the element to a second element or component which comprises sheet-like web material 20 carrying hardenable adhesive layer 18. The respective elements can be laminated under pressure, and optionally under heating conditions, to provide a unitary and laminar thermally actuatable imaging medium 10 of the invention. Laminar medium 10 can then be subjected to stress-inducing manipulatory or processing steps with minimized tendency toward delamination. In some instances, and depending upon the particular nature of the hardenable adhesive, a reciprocal stamping and cutting or slitting operation, which in the absence of a layer 18 would tend to delaminate the medium, can be performed to advantage. An additional step, for example, a step for the hardening of the hardenable layer 18 can then be performed to provide a durable base layer 18 for the provision of a correspondingly durable image 10*b*.

In the manufacture of medium 10, additional post-lamination steps (e.g., a bending, winding, cutting or slitting step) should be conducted within a predetermined time after the lamination step, as dictated by the particular nature of the hardenable adhesive layer 18, the applicable hardening mechanism required therefor, and the rate at which the hardening mechanism occurs or is performed. In general, it will be advantageous to perform post-lamination steps within about four to five hours. Depending, however, upon the aforementioned factors, it may be necessary to perform manipulatory operations within a relatively short time period after lamination. Such operations are desirably completed, in the case where a reactive system such as an epoxy or urethane system is used, within the useful pot-life period of the adhesive. In other instances, depending upon the nature of the hardenable adhesive layer, it may be beneficial to defer manipulatory operations until a predetermined period after the lamination, so as, for example, to allow for development of tack or other physical properties which tend to alleviate physical stresses.

The conduct of a hardening step within a predetermined time period will oftentimes be beneficial from the standpoints of minimizing the permeation or diffusion of unhardened material into other layers of the medium and of minimizing any adverse effects of such material on the proper functioning of such other layers or additives or agents (e.g., dyes) which may be adversely affected thereby.

Hardenable layer 18 can be hardened in a number of ways, depending principally upon the composition of the layer. For example, a reactive mixture of an isocyanate-terminated prepolymer, a diisocyanate reactant and a chain-extending agent can be coated to a layer and allowed to cure to a hardened polyurethane layer under ambient conditions or with the aid of heat. Alternatively, an epoxy system can be used. Thus a mixture of (a) a resin prepared by the reaction of an epoxy compound such as glycidol or epichlorohydrin and a bisphenolic compound such as 2,2-bis(4-hydroxyphenyl)-propane and (b) a fatty acid amide can be formulated, which mixture can be then coated and allowed to cure under ambient conditions. Other reactive mixtures can be coated and allowed to cure to a hardened layer, with or without the aid of heat, cross-linking agents, polymerization initiators or the like, depending upon the particular reaction system.

Among radiation-curable systems for preparing adhesive layer 18 are preformed polymers which contain pendant ethylenically unsaturated moieties which can be cross-linked by irradiation, using a photoinitiator. Preformed polymers having pendant cross-linkable groups include, for example, the reaction product of a hydroxyl-containing polymer (e.g., a polyester of a dicarboxylic acid and a polyhydric alcohol) and a vinyl monomer containing isocyanate groups (e.g., isocyanatoethyl acrylate or methacrylate). Cross-linking agents and photoinitiators can be used to provide a cross-linked polymer having urethane linkages.

Also suitable are compositions which contain a polymeric binder and a polymerizable ethylenically unsaturated monomer which can, by addition polymerization, be polymerized to a high molecular weight polymer. For example, acrylate and methacrylate esters of polyhydric alcohols such as pentaerythritol or trimethylolpropane can be cross-linked by ultraviolet irradiation using a photoinitiator such as an acetophenone derivative, benzoin or an alkyl-substituted anthraquinone. Other suitable initiators include azobisisobutyronitrile and azo-bis-4-cyano-pentanoic acid, although others can be employed. Cross-linking agents of the difunctional type, such as divinylbenzene, can also be used, to promote cross-linking via the unsaturated moieties of a polymerizable monomer and the cross-linking agent.

Among preferred compositions for layer 18 are compositions containing: a macromolecular organic binder; a photopolymerizable ethylenically unsaturated monomer having at least one terminal ethylenic group capable of forming a high polymer by free-radical initiated, chain-propagated addition polymerization; and a free-radical generating, addition polymerization-initiating system activatable by actinic radiation. Suitable macromolecular binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose ethers (e.g., methyl, ethyl and benzyl cellulose); synthetic rubbers (e.g., butadiene/acrylonitrile copolymers; chlorinated isoprene and chloro-2-butadiene-1,3-polymers); polyvinyl esters (e.g., polyvinyl acetate/acrylate copolymers, polyvinyl acetate and polyvinyl acetate/methylmethacrylate copolymers); polyacrylate and polyalkylacrylate esters (e.g., polymethymethacrylate); and polyvinyl chloride copolymers (e.g., vinyl chloride/vinylacetate copolymers).

Suitable photopolymerizable ethylenically unsaturated monomers for such compositions include the difunctional and trifunctional acrylates, such as the aforementioned acrylate and methacrylate esters of polyhydric alcohols (e.g., pentaerythritol triacrylate and trimethylolpropane triacrylate). Other suitable monomers include ethylene glycol diacrylate or dimethacrylate or mixtures thereof; glycerol diacrylate or triacrylate; urethane acrylates; and epoxy acrylates. In general, photopolymerizable monomers which provide tack in such compositions or which serve to plasticize the macromolecular binder will be preferred. Photoinitiators useful in the compositions for the initiation of monomer polymerization, using actinic radiation, include the aforementioned photoinitiators.

A preferred adhesive composition includes an acrylic macromolecular binder and a photopolymerizable trimethylolpropane triacrylate monomer and a photoinitiator. The photopolymerizable monomer serves to tackify the binder material and to permit production of a pressure-sensitive and tacky adhesive layer. Cutting and slitting operations can be performed after lamination and, upon curing, a hard layer is obtained.

In general, hardenable layer 18 can be coated as a thin to viscous layer. Preferably, a relatively viscous layer will be preferred from the standpoints of coating and handling and control of layer thickness, without loss of material by being pressed from within the laminate. Thickeners, binders and coating aids can be included to control viscosity and facilitate coating to a uniform and adhesive layer. Tack-promoting and pasticizing agents can be included for their known properties.

Hardening of adhesive layer 18 can be accomplished in known manner, according to the requirements dictated by the compositional nature of the layer. Where cross-linking is achieved by polymerization, conventional sources of ultraviolet radiation can be used, including carbon arc lamps, "D" bulbs, Xenon lamps and high pressure mercury lamps. The choice of a suitable irradiating source for hardening will also depend on the thickness of the layer to be hardened.

The thickness of hardenable polymeric layer can vary and, in general, will be in the range from 0.1 to 50 microns. A preferred range of thickness is from 0.5 to 20 microns.

It will be appreciated that the hardening of layer 18, and particularly the degree thereof, may reduce the further capacity of layer 18 to be absorptive of stress conditions or to otherwise prevent an unwanted delamination. Unhardened (hardenable) layer 18 can, however, be used to advantage during manufacture of medium 10 to minimize undesired delamination. After hardening, the medium can be packaged, handled and processed in a printer or other apparatus for imaging. If desired, the degree of hardening can be controlled such that hardening is substantially complete while still retaining a degree of softness to provide protection against delamination.

As is known in the art, photopolymerization systems are oftentimes sensitive to atmospheric oxygen. The use of cross-linkable compositions as aforedescribed and which are sensitive to oxygen can be used to advantage. Individually cut units of medium 10 tend, at the edgemost regions of layer 18 about the perimeter of the laminar medium, to be incompletely cross-linked (polymerized) and to retain a degree of softness which reduces the tendency for the medium to delaminate.

If desired, medium 10 can include an auxiliary layer to provide protection against the delamination of the medium. Such a layer will be preferred where rigorous physical stresses may be applied to the medium and where hardenable layer 18 may not provide sufficient protection thereagainst. Thus, a stress-absorbing layer (not shown) can be incorporated between layers 12*a* and 12*b*, and, upon hardening of hardenable layer 18, stress-absorbing functionality is present in the medium for protection against undesired delamination. A compressible or elongatable polyurethane layer can be used as such a stress-absorbing layer and is described in the aforementioned U.S. Pat. No. 5,200,297, of Neal F. Kelly.

The use of hardenable layer 18 in medium 10 is advantageous from the standpoint of permitting lamination of the components thereof without the requirement of elevated temperatures that may have an adverse influence on other layers or components of the medium. While heat and pressure can be used to effect the lamination, pressing of the components without heat can be used to provide the lamination. The use of a hardenable layer 18 that can be cured under ambient room conditions reduces the required dwell time to achieve lamination and increases manufacturing efficiency.

According to a preferred embodiment, and as shown in FIG. 1, a release layer 16 is included in thermal imaging medium 10 to facilitate separation of images 10*a* and 10*b* according to the mode shown in FIG. 2. As described hereinbefore, regions of medium 10 subjected to radiation become more firmly secured to heat-activatable zone or layer 12*b* by reason of the heat activation of the layer by the exposing radiation. Non-exposed regions of layer 14 remain only weakly adhered to heat-activatable zone or layer 12*b* and are carried along with web 20 on separation of web materials 12 and 20. This is accomplished by the adhesion of layer 14 to heat-activatable zone or layer 12*b*, in non-exposed regions, being less than: (a) the adhesion between layers 14 and 16; (b) the adhesion between layers 16 and 18; (c) the adhesion between layers 18 and 20; and (d) the cohesivity of layers 14, 16 and 18. The adhesion of web material 20 to porous or particulate layer 14, while sufficient to remove non-exposed regions of porous and particulate layer 14 from heat-activatable zone or layer 12*b*, is controlled, in exposed areas, by release layer 16 so as to prevent removal of firmly attached exposed portions 14*a* of layer 14 (attached to heat-activated zone or layer 12*b* by exposure thereof).

Release layer 16 is designed such that its cohesivity or its adhesion to either adhesive 18 or porous or particulate layer 14 is less, in exposed regions, than the adhesion of layer 14 to heat-activated zone or layer 12*b*. The result of these relationships is that release layer 18 undergoes an adhesive failure in exposed areas at the interface-between layers 16 and 18, or at the interface between layers 14 and 16; or, as shown in FIG. 2, a cohesive failure of layer 16 occurs, such that portions (16*b*) are present in image 10*b* and portions (16*a*) are adhered in exposed regions to porous or particulate portions 14*a*. Portions 16*a* of release layer 16 serve to provide surface protection for the image areas of image 10*a*, against abrasion and wear.

Release layer 16 can comprise a wax, wax-like or resinous material. Microcrystalline waxes, for example, high density polyethylene waxes available as aqueous dispersions, can be used for this purpose. Other suitable materials include carnauba, beeswax, paraffin wax and wax-like materials such as poly(vinylstearate), polyethylene sebacate, sucrose polyesters, polyalkylene oxides and dimethylglycol phthalate. Polymeric or resinous materials such as poly(methylmethacrylate) and copolymers of methyl methacrylate and monomers copolymerizable therewith can be employed. If desired, hydrophilic colloid materials, such as polyvinylalcohol, gelatin or hydroxyethyl cellulose can be included as polymer binding agents.

Resinous materials, typically coated as latexes, can be used and latices of poly(methyl methacrylate) are especially useful. Cohesivity of layer 16 can be controlled so as to provide the desired and predetermined fractioning. Waxy or resinous layers which are disruptible and which can be fractured sharply at the interfaces of particles thereof can be used to advantage. If desired, particulate materials can be added to the layer to reduce cohesivity. Examples of such particulate materials include, silica, clay particles and particles of poly(tetrafluoroethylene).

As can be seen from FIG. 2, the relationships of adhesivity and cohesivity among the several layers of imaging medium 10 are such that separation occurs between layer 14 and heat-activatable zone or layer 12*b* in non-exposed regions. Thus, imaging medium 10, if it were to be separated without exposure, would separate between heat-activatable zone or layer 12*b* and layer 14 to provide a $D_{max}$ on sheet 20. The nature of image-forming layer 14 is such, however, that its relatively weak adhesion to heat-activatable zone or layer 12*b* can be substantially increased upon exposure. Thus, as shown in FIG. 2, exposure of medium 10 to brief and intense radiation in the direction of the arrows and in the areas defined by the respective pairs of arrows, serves in the areas of exposure to substantially lock or attach layer 14, as portions 14*a*, to heat-activatable zone or layer 12*b*.

Attachment of weakly adherent image-forming layer 14 to heat-activatable zone or layer 12*b* in areas of exposure is accomplished by absorption of radiation within the imaging medium and conversion to heat sufficient in intensity to heat activate zone or layer 12*b* and on cooling to more firmly join exposed regions or portions of layer 14 to heat-activatable zone or layer 12*b*. Thermal imaging medium 10 is capable of absorbing radiation at or near the interface of heat-activatable zone or layer 12*b*. This is accomplished by using layers in medium 10 which by their nature absorb radiation and generate the requisite heat for desired thermal imaging, or by including in at least one of the layers, an agent capable of absorbing radiation of the wavelength of the exposing source. Infrared-absorbing dyes can, for example, be suitably employed for this purpose.

If desired, porous or particulate image-forming substance 14 can comprise a pigment or other colorant material such as carbon black which, as is more completely described hereinafter, is absorptive of exposing radiation and which is known in the thermographic imaging field as a radiation-absorbing pigment. Inasmuch as a secure bonding or joining is desired at the interface of layer 14 and heat-activatable zone or layer 12*b*, it may be preferred in some instances that a light-absorbing substance be incorporated into either or both of image-forming layer 14 and heat-activatable zone or layer 12*b*.

Suitable light-absorbing substances in layers 14 and/or 12*b*, for converting light into heat, include carbon black, graphite or finely divided pigments such as the sulfides or oxides of silver, bismuth or nickel. Dyes such as the azo dyes, xanthene dyes, phthalocyanine dyes or the anthraquinone dyes can also be employed for this purpose. Especially preferred are materials which absorb efficiently at the particular wavelength of the exposing radiation. In this connection, infrared-absorbing dyes which absorb in the infrared-emitting regions of lasers which are desirably used for thermal imaging are especially preferred. Suitable examples of infrared-absorbing dyes for this purpose include the alkylpyrylium-squarylium dyes, disclosed in U.S. Pat. No. 4,508,811 (issues Apr. 2, 1985 to D. J. Gravesteijn, et al.), and including 1,3-bis[2,6-di-t-butyl-4H-thiopyran-4-ylidene)methyl]-2,4-dihydroxy-dihydroxidecyclobutene diylium-bis{inner salt}. Other suitable IR-absorbing dyes include 4-[7-(4H-pyran-4-ylide)hepta1,3,5-trienyl]pyrylium tetraphenylborate and 4-[[3-[7-diethylamino-2-(1,1-dimethylethyl)—benz[b]-4H-pyran-4-ylidene)methyl]-2-hydroxy-4-oxo-2-cyclobuten-1-ylidene]methyl]-7-diethylamino-2-(1,1-dimethylethyl)-benz[b]pyrylium hydroxide inner salt. These and other IR-absorbing dyes are disclosed in the commonly assigned patent application of Z. J. Hinz, et al., entitled Heptamethine Pyrylium Dyes, and Processes for Their Preparation and Use as Near Infra-Rad Absorbers, U.S. Ser. No. 07/616,651, filed Nov. 21, 1990 and now abandoned; and in the commonly assigned and copending application of S. J. Telfer, et al., entitled Benzpyrylium Squarylium Dyes, and Processes for Their Preparation and Use U.S. Ser. No. 616,639, filed Nov. 21, 1990.

Thermal imaging laminar medium 10 can be imaged by creating (in medium 10) a thermal pattern according to the information imaged. Exposure sources capable of providing radiation which can be imaged onto medium 10, and which can be converted by absorption into a predetermined pattern, can be used. Gas discharge lamps, Xenon lamps and lasers are examples of such sources.

The exposure of medium 10 to radiation can be progressive or intermittent. For example, a two-sheet laminar medium, as shown in FIG. 1, can be fastened onto a rotating drum for exposure of the medium through web material 12. A light spot of high intensity, such as is emitted by a laser, can be used to expose the medium 10 in the direction of rotation of the drum, while the laser is moved slowly in a transverse direction across the web, thereby to trace out a helical path. Laser drivers, designed to fire corresponding lasers, can be used to intermittently fire one or more lasers in an imagewise and predetermined manner to thereby record information according to an original to be imaged. As is shown in FIG. 2, a pattern of intense radiation can be directed onto medium 10 by exposure to a laser from the direction of the arrows 22 and 22' and 24 and 24', the areas between the respective pairs of arrows defining regions of exposure.

If desired, a thermal imaging laminar medium of the invention can be imaged using a moving slit or stencils or masks, and by using a tube or other source which emits radiation continuously and which can be directed progressively or intermittently onto medium 10. Thermographic copying methods can be used, if desired.

Preferably, a laser or combination of lasers will be used to scan the medium and record information in the form of very fine dots or pels. Semiconductor diode lasers and YAG lasers having power outputs sufficient to stay within upper and lower exposure threshold values of medium 10 will be preferred. Useful lasers may have power outputs in the range of from about 40 milliwatts to about 1000 milliwatts. An exposure threshold value, as used herein, refers to a minimal power required to effect an exposure, while a maximum power output refers to a power level tolerable by the medium before "burn out" occurs. Lasers are particularly preferred as exposing sources inasmuch as medium 10 may be regarded as a threshold-type of film; i.e., it possesses high contrast and, if exposed beyond a certain threshold value, will yield maximum density, whereas no density will be recorded below the threshold value. Especially preferred are lasers which are capable of providing a beam sufficiently fine to provide images having resolution as fine as one thousand (e.g., 4,000–10,000) dots per centimeter.

Locally applied heat, developed at or near the interface of image-forming layer 14 and heat-activatable zone or layer **12*b*** can be intense (about 400° C.) and serves to effect imaging in the manner aforedescribed. Typically, the heat will be applied for an extremely short period, preferably in the order of <0.5 microsecond, and exposure time span may be less than one millisecond. For instance, the exposure time span can be less than one millisecond and the temperature span in exposed regions can be between about 100° C. and about 1000° C.

Apparatus and methodology for forming images from thermally actuatable media such as the medium of the present invention are described in detail in the commonly assigned patent application of E. B. Cargill, et al., entitled, Printing Apparatus, U.S. Ser. No. 07/616,658, filed Nov. 21, 1990, and now abandoned in favor of continuation application U.S. Ser. No. 07/955,360, filed Oct. 1, 1992; and in the commonly assigned patent application of J. A. Allen, et al., entitled, Printing Apparatus and Method, U.S. Ser. No. 07/616,786, filed Nov. 21, 1990.

The imagewise exposure of medium 10 to radiation creates in the medium latent images which are viewable upon separation of the sheets thereof (12 and 20) as shown in FIG. 2. Sheet 20 can comprise any of a variety of plastic, paper or other materials, depending upon the particular application for image **10*b*. Thus, a paper sheet material 20 can be used to provide a reflective image. In many instances, a transparency will be preferred, in which case, a transparent sheet material 20 will be employed. A polyester (e.g., polyethylene terephthalate) sheet material is a preferred material for this purpose. It will be appreciated that, depending upon the required curing condition for hardenable layer 18, the use of a transparent sheet 20 may be required, as in the case where layer 18 is hardened by exposure to radiation. Preferably, each of sheet-like web materials 12 and 20** will be flexible polymeric sheets.

The thermal imaging medium of the invention is especially suited to the production of hardcopy images produced by medical imaging equipment such as x-ray equipment, CAT scan equipment, MR equipment, Ultrasound equipment and so forth. As is stated in Neblette's Handbook of Photography and Reprography, Seventh Edition, Edited by John M. Sturge, Van Nostrand and Reinhold Company, at pp. 558–559: "The most important sensitometric difference between x-ray films and films for general photography is the contrast. X-ray films are designed to produce high contrast because the density differences of the subject are usually low and increasing these differences in the radiograph adds to its diagnostic value . . . Radiographs ordinarily contain densities ranging from 0.5 to over 3.0 and are most effectively examined on an illuminator with adjustable light intensity . . . Unless applied to a very limited density range the printing of radiographs on photographic paper is ineffective because of the narrow range of density scale of papers." The medium of the present invention can be used to advantage in the production of medical images using printing apparatus, as described in the aforementioned U.S. application U.S. Ser. No. 616,658 of E. B. Cargill, et al. filed Nov. 21, 1990, and now abandoned in favor of continuation application U.S. Ser. No. 07/955,360, filed Oct. 1, 1992 which is capable of providing a large number of gray scale levels.

The use of a high number of gray scale levels is most advantageous at high densities inasmuch as human vision is most sensitive to gray scale changes which occur at high density. Specifically, the human visual system is sensitive to relative change in luminance as a function of $dL/L$ where $dL$ is the change in luminance and $L$ is the average luminance. Thus, when the density is high, i.e., $L$ is small, the sensitivity is high for a given $dL$ whereas if the density is low, i.e., $L$ is large, then the sensitivity is low for a given $dL$. In accordance with this, the medium of the present invention is especially suited to utilization with equipment capable of providing small steps between gray scale levels at the high end of the gray scale, i.e., in the high contrast region of greatest value in diagnostic imaging. Further, it is desirable that the high density regions of the gray scale spectrum be rendered as accurately as possible, inasmuch as the eye is more sensitive to errors which occur in that region of the spectrum.

The medium of the present invention is especially suited to the production of high density images as image 10*b*, shown in FIG. 2. It has been noted previously that separation of sheets 12 and 20 without exposure, i.e., is in an unprinted state, provides a totally dense image in colorant material on sheet 20 (image 10*b*). The making of a copy entails the use of radiation to cause the image-forming colorant material to be firmly attached to web 12. Then, when sheets 12 and 20 are separated, the exposed regions will adhere to web 12 while unexposed regions will be carried to sheet 20 and provide the desired high density image 10*b*. Since the high density image provided on sheet 20 is the result of "writing" on sheet 12 with a laser to firmly anchor to sheet 12 (and prevent removal to sheet 20) those portions of the colorant material which are unwanted in image 10*b*, it will be seen that the amount of laser actuation required to produce a high density image can be kept to a minimum. A method for providing a thermal image while keeping exposure to a minimum is disclosed and claimed in the commonly assigned patent application of M. R. Etzel, entitled, Printing Method, U.S. Ser. No. 07/616,406, filed Nov. 21, 1990, and now abandoned.

If medium 10 were to be exposed in a manner to provide a high density image on sheet 12, it will be appreciated that the high density gray scale levels would be written on sheet 12 with a single laser at an inefficient scanning speed or by the interaction of a number of lasers, increasing the opportunity for tracking error. Because medical images are darker than picture photographs and tracking errors are more readily detected in the high density portion of gray scale levels, a printing apparatus, using medium 10, would need to be complex and expensive to achieve a comparable level of accuracy in the production of a high density medical image on sheet 12 as can be achieved by exposing the medium for production of the high density image on sheet 20.

Inasmuch as image 10*b*, by reason of its informational content, aesthetics or otherwise, will oftentimes be considered the principal image of the pair of images formed from medium material 10, it may be desired that the thickness of sheet 20 be considerably greater and more durable than sheet 12. In addition, it will normally be beneficial from the standpoints of exposure and energy requirements that sheet 12, through which exposure is effected, be thinner than sheet 20. Asymmetry in sheet thickness may increase the tendency of the medium material to delaminate during manufacturing or handling operations. Utilization of hardenable adhesive layer 18 will be preferred in medium 10 particularly to prevent delamination during manufacture of the medium.

If desired, further protection for the image 10*b* against abrasion and added durability can be achieved by including an additional layer (not shown) of a thermoplastic material intermediate image-forming layer 14 and surface zone or layer 12*b*, which additional layer comprises a polymeric disruptible layer fracturable substantially along the exposure direction and which provides surface protective portions (over image portions 14*b*) for improved durability of image 10*b*. A laminar thermal imaging medium including a thermoplastic intermediate layer to provide surface protection of an image prepared therefrom is disclosed and claimed in U.S. Pat. No. 5,155,003, issued Oct. 13, 1992 to K. C. Chang and entitled Thermal Imaging Medium Alternatively, additional durability can be provided to image 10*b* by depositing a protective polymeric overcoat layer thereon. A protected image and method therefor are disclosed and claimed in the patent application of A. Fehervari, et al., entitled, Protected Image, and Process for the Production Thereof, U.S. Ser. No. 07/616,851, filed Nov. 21, 1990.

The following examples are presented for purposes of illustrating the invention but are not to be taken as limiting the invention. All parts, ratios and proportions, except where otherwise indicated, are by weight.

EXAMPLE 1

Onto a first sheet-like web of polyethylene terephthalate of 1.75-mil (0.044 mm) thickness were deposited the following layers, in succession:

a 0.5-micron thick heat-activatable layer of poly(styrene-co-acrylonitrile);

a 0.9-micron thick layer of carbon black pigment, polyvinylalcohol (PVA), polytetrafluoroethylene particles and styrenated acrylate dispersing agent (Joncryl 67, from Johnson Wax Company, Racine, Wis.) at ratios, respectively of 5/1/1/0.5;

a 0.28-micron thick release layer comprising ten parts co-emulsified high-density polyethylene/carnauba waxes, exhibiting melting points at 82° C. and 135° C. (from Michenlube 110 wax emulsion of Michelman Chemicals, Inc.); ten parts silica and one part PVA; and a 2.5-micron thick adhesive layer comprising 60/40 poly(methylmethacrylate-co-ethylmethacrylate) having a Tg of 45° C., available as Hycar-26256 latex from The B. F. Goodrich Company.

Onto a second sheet-like web of polyethylene terephthalate, of seven-mil (0.178 mm) thickness, was deposited a layer of ultraviolet(UV)-curable adhesive. The UV-curable adhesive was formulated by adding 135 parts of trimethylolpropane triacrylate monomer (Sartomer Company, West Chester, Pa.) to a solution containing: 83 parts poly(methylmeth-acrylate-co-isobutylmethacrylate), available as Elvacite 2045 from E. I. duPont de Nemours and Company; 169 parts of 50% solution of acrylic polymer in toluene, available as Acryloid F 10-T from Rohm & Haas Company; 0.13 part methoxyhydroquinone; and 18 parts of acetophenone-derivative photoinitiator, available as Irgacure 651 from Ciba-Geigy Company. The resulting formulation was dissolved in a solvent blend of 560 parts ethylacetate and 34 parts methyl ethyl ketone. The resulting UV-curable composition was coated onto the aforedescribed polyethylene terephthalate sheet and the sheet was traversed through an oven at about 185° F. for removal of solvent and was impinged with air and dried. The UV-curable adhesive was a pressure-sensitive adhesive having a thickness of about 17 microns and a tacky nature in its uncured condition.

The first and second polyethylene terephthalate web materials were immediately brought into face-to-face contact, the seven-mil sheet being in contact with a heated rotating steel drum (95°–100° F.). A rubber roll having a Durometer hardness of 70–80 was pressed against the 1.75-mil web material. The resulting laminar medium was wound onto a take-up roll (1.75-mil web material outermost) for flattening of the medium material and unwound to a slitting station where edgewise trimming along both edges of the medium was performed in the machine direction. The laminar medium was punch-cut to individual units. The individual units (separated from the surround, sent to waste) were passed under a radio frequency powered source of ultraviolet radiation, with the seven-mil sheet of each unit facing the source at a distance of about 2.5 inches (6.4 cm) from the source (a Model DRS-111 Deco Ray Conveyorized Ultraviolet Curing System, Fusion UV Curing Systems, Rockville, Md.).

Individual units of medium prepared as described in this example were imaged by laser exposure (through the 1.75-mil of the polyester sheet thereof) using high intensity semiconductor lasers. In each case, the laminar medium was fixed (clamped) to a rotary drum with the seven-mil polyester component thereof facing the drum. The radiation of semiconductor lasers was directed through the 1.75-mil polyester sheet thereof in an imagewise manner in response to a digital representation of an original image to be recorded in the thermally actuatable medium. After exposure to the high-intensity radiation (by scanning of the imaging medium orthogonally to the direction of drum rotation) and removal of the thus-exposed imaging medium from the drum, the respective sheets of the imaging elements were separated to provide a first image on the first 1.75-mil polyester sheet and a second (and complementary) image on the second (7-mil) polyester sheet (the principal image).

In each instance, the principal images were evaluated by a fingernail test, according to which, the observer would apply a fingernail to the surface of each image, and after oft-repeated stroking under pressure purposefully to mar the image surface, would examine the image surface visually to determine the effects thereof. In each instance, the principal image provided by the imaging medium of this example showed a low level of surface marring. Comparable units in which the hardenable layer 18 had not been UV cured, owing to the softness of the layer, were not susceptible of fingernail testing.

EXAMPLE 2

Onto a first sheet of polyethylene terephthalate of 1.75-mil(0.044 mm) thickness were deposited the following layers, in succession:

a 0.5-micron thick heat-activatable layer comprising 50 parts poly(styrene-co-acrylonitrile) and 50 parts poly(methylmethacrylate-co-n-butylmethacrylate), having a Tg of 60° C. and available as Acryloid B-44 polymer from Rohm and Haas Company;

a 0.8-micron thick layer of carbon black pigment and PVA, at a ratio of 5:1; and a 0.4-micron thick release layer comprising: ten parts high-density polyethylene wax (from Michelman-42540 anionic-emulsified wax dispersion); ten parts silica; and one part poly(styrene-co-maleic anhydride).

A second sheet, polyethylene terephthalate of seven-mil(0.178 mm) thickness, was provided with a five-micron thick layer of epoxy adhesive by coating and drying a composition comprising 100 parts epoxy resin (Epon 828 from Shell Chemical Co.); 60 parts fatty polyamide (Ancamide 350A, from Pacific Anchor Chemical Corp.); 221 parts methyl ethyl ketone; and 0.19 part fluorosurfactant (FC-430, from 3M Co.). The resulting sheet and the aforedescribed first sheet were each cut into a plurality of sheets of predetermined size and were laminated at room temperature to provide laminar imaging elements of the invention. The imaging elements were allowed to cure at room temperature for periods of from three to five days. The imaging elements were, during the curing period, handled and flexed without delamination.

What is claimed is:

1. A laminar thermal imaging medium, actuatable in response to intense image-forming radiation for production of an image, said laminar medium comprising in order:

a first sheet transparent to said image-forming radiation and having at least a surface zone or layer of polymeric material heat-activatable upon exposure of said thermal imaging medium to brief and intense radiation;

a layer of porous or particulate image-forming substance having cohesivity in excess of its adhesivity for said polymeric heat-activatable layer;

a second sheet covering said layer of porous or particulate image-forming substance and adhesively laminated directly or indirectly to said image-forming substance by an adhesive layer;

said medium being capable of absorbing said brief and intense radiation at or near the interface of said heat-activatable polymeric material and said layer of porous or particulate image-forming substance and of converting absorbed radiation into heat;

said heat-activatable polymeric material being activatable by said heat for attachment, firmly to said first sheet, of portions of said layer of image-forming substance exposed to said brief and intense radiation, said exposed and firmly attached portions, on separation of said first and second sheets after said exposure, providing a first image, in said image-forming substance on said first sheet;

said second sheet, upon separation of said first and second sheets after said exposure, carrying therewith a second image, in unexposed portions of said image-forming substance;

said adhesive layer being a polymeric hardenable adhesive layer, said hardenable adhesive layer being capable in its unhardened condition of reducing the tendency for said laminar thermal imaging medium to delaminate on application of physical stresses to said medium and being hardenable, by reaction curing of components thereof or by radiation curing on exposure to actinic radiation, to a layer of sufficient hardness to provide a durable base for said image carried on said second sheet.

2. The laminar thermal imaging medium of claim 1 wherein said polymeric hardenable adhesive layer comprises a polymeric hardenable material having a compressible or elongatable character.

3. The laminar thermal imaging medium of claim 2 wherein said polymeric hardenable adhesive layer is capable of reducing the delamination of said medium by stresses created by the cutting of said laminar thermal imaging medium.

4. The laminar thermal imaging medium of claim 1 wherein each of said pair of sheet members comprises a flexible polymeric sheet.

5. The laminar thermal imaging medium of claim 4 wherein each of said sheets comprises polyethylene terephthalate.

6. The laminar thermal imaging medium of claim 5 wherein said polymeric hardenable adhesive layer has a thickness of from 0.1 micron to 50 microns.

7. The laminar thermal imaging medium of claim 1 wherein said polymeric hardenable adhesive layer comprises a polymer having pendant ethylenically unsaturated moieties which can be cross-linked by actinic irradiation in the presence of a photoinitiator.

8. The laminar thermal imaging medium of claim 1 wherein said polymeric hardenable adhesive layer comprises a macromolecular organic binder; a photopolymerizable ethylenically unsaturated monomer having at least one terminal ethylenic group capable of forming a high molecular weight polymer by free radical-initiated, chain-propagated addition polymerization; and a free radical-generating, addition polymerization-initiating system activatable by actinic radiation.

9. The laminar thermal imaging medium of claim 1 wherein said polymeric hardenable adhesive layer is reactively curable to a polyurethane or polyepoxide durable resin layer.

10. The laminar thermal imaging medium of claim 1 wherein said polymeric hardenable adhesive layer is photopolymerizable to a durable layer.

11. The laminar thermal imaging medium of claim 10 wherein said polymeric hardenable layer is photopolymerizable to a durable layer by ultraviolet irradiation.

12. The laminar thermal imaging medium of claim 1 wherein said polymeric hardenable adhesive layer is laminated to said layer of image-forming substance through a release layer, said release layer being adapted to facilitate separation between said first and second sheets and to provide, respectively, said first and second images.

* * * * *